(12) United States Patent
Chien et al.

(10) Patent No.: US 10,020,209 B2
(45) Date of Patent: Jul. 10, 2018

(54) FINE TEMPERATURE CONTROLLABLE WAFER HEATING SYSTEM

(71) Applicant: Taiwan Semiconductor Manufacturing Company, Ltd., Hsin-Chu (TW)

(72) Inventors: Ying-Hsueh Chang Chien, Hsinchu (TW); Chi-Ming Yang, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 127 days.

(21) Appl. No.: 15/161,429

(22) Filed: May 23, 2016

(65) Prior Publication Data

US 2016/0268147 A1   Sep. 15, 2016

Related U.S. Application Data

(62) Division of application No. 14/169,337, filed on Jan. 31, 2014, now Pat. No. 9,349,623.

(60) Provisional application No. 61/786,290, filed on Mar. 14, 2013.

(51) Int. Cl.
H01L 21/67   (2006.01)
H01L 21/66   (2006.01)
H01L 21/68   (2006.01)

(52) U.S. Cl.
CPC .... *H01L 21/6708* (2013.01); *H01L 21/67051* (2013.01); *H01L 21/67098* (2013.01); *H01L 21/67103* (2013.01); *H01L 21/67109* (2013.01); *H01L 21/67248* (2013.01); *H01L 21/68* (2013.01); *H01L 22/26* (2013.01)

(58) Field of Classification Search
CPC ........... H01L 21/67051; H01L 21/6708; H01L 21/67098
See application file for complete search history.

(56) References Cited

U.S. PATENT DOCUMENTS

| | | | |
|---|---|---|---|
| 6,064,799 A | 5/2000 | Anderson et al. | |
| 7,427,728 B2 | 9/2008 | Salinas et al. | |
| 8,088,675 B2 | 1/2012 | Rana et al. | |
| 2008/0006619 A1 | 1/2008 | Salinas et al. | |
| 2008/0295885 A1* | 12/2008 | Lee | C30B 13/24 136/256 |
| 2010/0240172 A1 | 9/2010 | Rana et al. | |
| 2012/0080061 A1 | 4/2012 | Kim et al. | |

(Continued)

*Primary Examiner* — Mounir Amer
(74) *Attorney, Agent, or Firm* — Haynes and Boone, LLP

(57) ABSTRACT

Disclosed are a method and a system for processing wafers in fabricating a semiconductor device where disposing chemicals and wafer heating are needed for chemical reaction. A wafer is placed above a wafer heater such that a second surface faces the wafer heater, and heated from the second surface. A chemical layer is formed on an opposing first surface. The wafer heater is sized and configured to be capable of heating the entire second surface, and adapted to produce a locally differential temperature profile if needed. During heating, an actual temperature profile on the wafer may be monitored and transmitted to a computing system, which may generate a target temperature profile and control the wafer heater to adjust local temperatures on the wafer according to the target temperature profile. A supplemental heater for heating the chemicals may be used for finer control of the wafer temperature.

20 Claims, 4 Drawing Sheets

(56) References Cited

U.S. PATENT DOCUMENTS

2012/0260947 A1 10/2012 Kaneko et al.
2014/0273302 A1 1/2014 Chien et al.

* cited by examiner

FINE TEMPERATURE CONTROLLABLE WAFER HEATING SYSTEM

PRIORITY DATA

The present application is a divisional application of U.S. application Ser. No. 14/169,337, filed Jan. 31, 2014, which claims the benefit of U.S. Provisional Application No. 61/786,290, filed on Mar. 14, 2013, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. In addition to IC components becoming smaller and more complex, wafers on which the ICs are fabricated are becoming larger. For example, current wafer size is 300 mm, and in coming 5 year may enter into 450 mm wafer production.

Wafers are processed in many ways, some of which are done while the wafer is secured on a planar wafer platform (e.g., table, holder, or chuck) in a process chamber of a wafer processing tool. In many steps of wafer processing, such as pre-cleaning, post-cleaning, or various etching steps, chemical materials such as cleaning agents or etchants are added to a surface of the wafer to form or modify layer(s) of material on the surface. To boost chemical reactions for the process, the wafer often needs to be heated to a suitable temperature. In the conventional methods practiced in the current art, the heat is directly supplied to the layer formed on the wafer by an overhead heater located above the wafer, and thereby, to the wafer below. Some heaters are configured to move over the wafer surface, and some are fixed.

The current methods practiced in the art, however, have a several deficiencies. One is caused by a non-uniform heat distribution across the wafer. Since the overhead heater heats the chemical layer only locally, the layer and the wafer below cannot have uniformity in temperature. Even if the heater is configured to move around over the wafer while heating, the uniformity obtainable is limited and the non-uniformity cannot be totally eliminated. The non-uniformity in temperature is aggravated by the increased wafer size, as well as any non-uniformity in the chemical layer itself caused by the currently used system of depositing chemical material on the wafer, which typically uses sprayers. With such sprayers, whether moving or fixed, the material sprayed on the wafer will not be uniform.

Another deficiency is due to directly heating up the chemical materials. The temperature to which the chemical materials are heated is subject to a temperature constraint imposed by the chemical property of the chemical materials. For example, the chemical material may need to be heated up past its boiling point for various reasons, at which the material changes from liquid to gas. Since the temperature of the chemicals does not change for the duration of the phase change of the chemicals despite continued application of heat energy, the temperature of the wafer does not increase as desired at the cost of heat energy during this period. Moreover, the abrupt, dramatic volume expansion of the chemical gas following the liquid-gas phase change not only impairs the reaction rate from the loss of available liquid state chemicals at which most chemical reactions most actively occur, but also causes pattern damage or collapse. Further, in the high temperature environment in the vaporized phase of the chemicals in which the temperature rapidly increases, it is much harder to control or fine-tune a temperature profile on the wafer as precisely as desired for optimum reaction rate and uniformity.

Therefore, to prevent the pattern collapse induced by sudden volume expansion of vaporized chemical gas, to ensure more fine-tuned control over the temperature of the wafer and thus over optimum reaction rate, and to obtain more temperature uniformity across the wafer, it is desirable to provide a method and a system for heating up a wafer that can produce a uniform, or any desired temperature profile on the wafer determined for optimum reaction rate. Further, it is also desirable to provide a method and a system for heating up a wafer that can provide a closer and finer control over the temperature of the wafer in a milder temperature environment that does not invoke the damaging expansion of the chemical gas on the wafer surface from its phase change.

BRIEF DESCRIPTION OF THE DRAWINGS

The present disclosure is best understood from the following detailed description when read with accompanying figures. It is emphasized that, in accordance with the standard practice in the industry, various features in the drawings are not drawn to scale and are used for illustration purpose only. In fact, the dimension of the various features may be arbitrarily increased or reduced for clarity of discussion.

DETAILED DESCRIPTION

Figure 1:
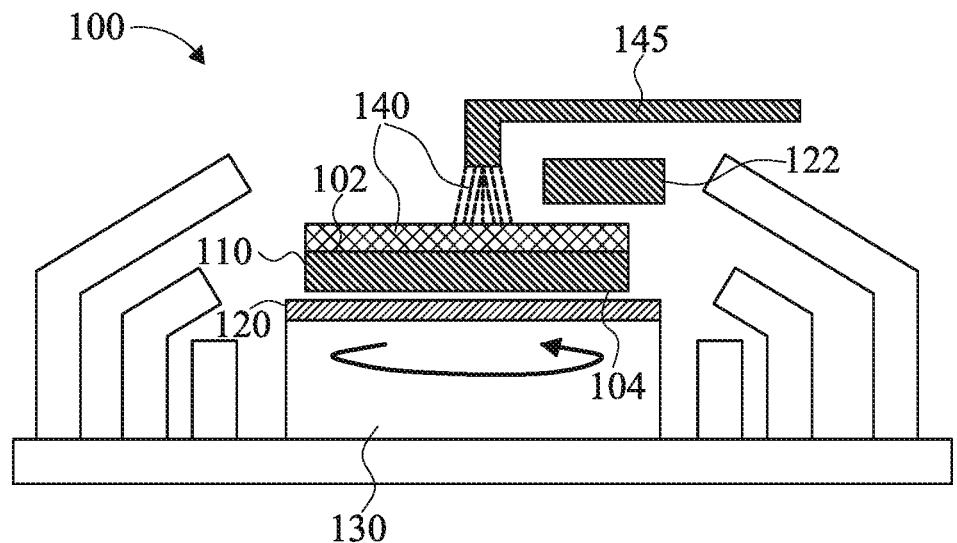
FIG. 1 schematically shows a system and a method performed to process wafers, particularly for heating a wafer, in fabricating a semiconductor device in an aspect of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to a method and system of heating a wafer during a wafer processing for fabricating a semiconductor device. More particularly, the present disclosure provides a way to heat up a wafer in more controlled, fine-tuned way in a milder temperature environment so that the problem of potential pattern collapse from explosive expansion of chemical gas from its liquid-gas phase transition at high temperature may be prevented. Further, the method and system in the present disclosure enables the wafer to be heated up in any desired temperature profile, whether uniform or spatially differential, through direct heating of the wafer so as to boost up the chemical reaction rate on the wafer, and thereby speeds up the wafer processing.

FIG. 1 describes a system 100 for implementing various embodiments of the present disclosure. The system includes a wafer processing platform 130 in a process chamber, upon which a wafer 110 is to be placed for various kinds of wafer processing. The platform 130 could be a flat stage, such as a wafer stage in a stepper, sized and configured to place the wafer 110 of various sizes used in the current art thereon for processing. The platform 130 may have a suitable means for securing the wafer 110 so that the wafer 110 may not be displaced, shaken, or misaligned during the processing. In some embodiment, the platform may be equipped with a suitable means for make an ultra-fine alignment of the wafer 110 to a predetermined orientation and position for a highly precise processing. This system will be further discussed below, with reference to the method of FIG. 3.

Figure 2:
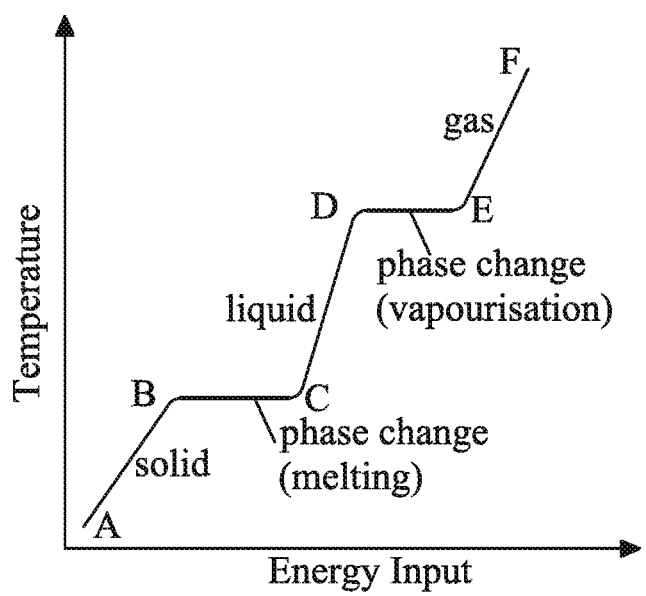
FIG. 2 is a typical phase change diagram for a chemical material disposed on a wafer during a wafer processing for fabricating a semiconductor device.

FIG. 2 is a typical phase change diagram for a chemical material. During the time intervals of two phase changes, from solid to liquid and from liquid to gas, respectively, the temperature curve forms plateaus, at which the temperature stays stationary despite continued application of heat energy. Such a nonlinear, deadlock situation in the behavior of the temperature of the chemical material during the phase change makes it hard to control the temperature of the wafer. A greater problem for the conventional way of directly heating the chemical material is that the inevitable liquid to gas phase change results in abrupt and dramatic expansion of the volume of the chemical gas, which in turn may induce serious deformation or collapse of the pattern formed on the wafer.

Figure 3:
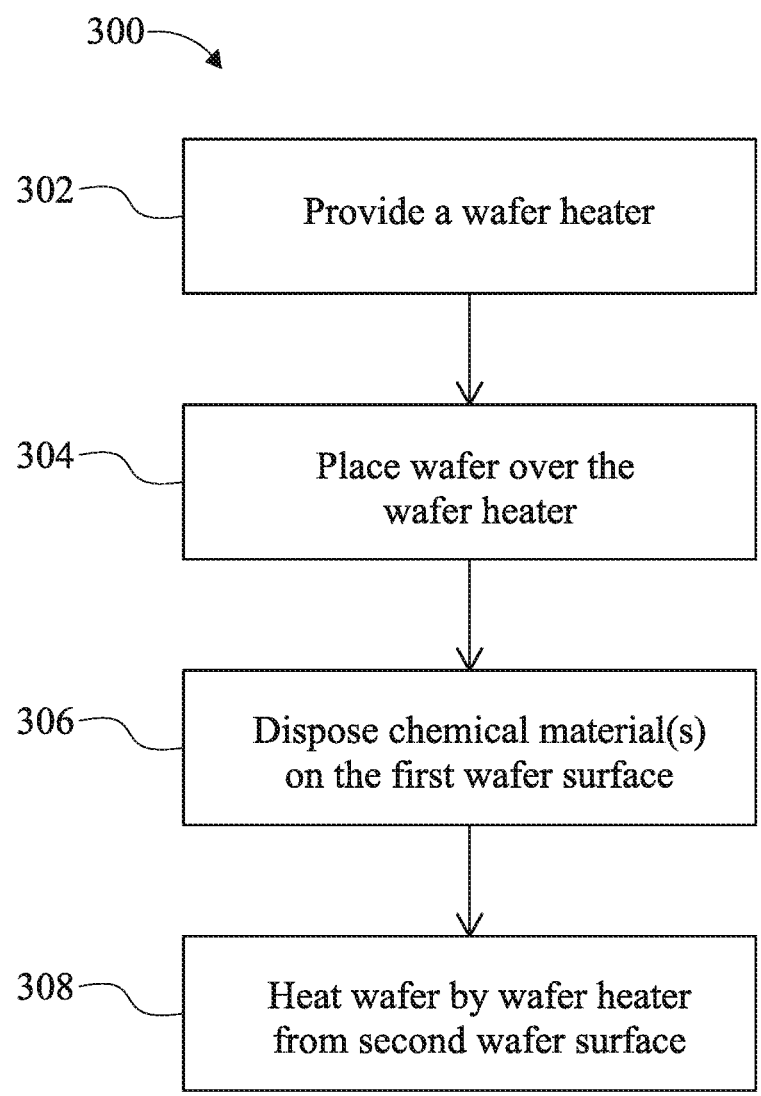
FIG. 3 is a schematic diagram of a method performed to process wafers in fabricating a semiconductor device in an aspect of the present disclosure.

FIG. 3 is a schematic diagram of a method 300 performed to process wafers in fabricating a semiconductor device in an aspect of the present disclosure. The steps of the method 300 in FIG. 3 will be described herein while referring to FIGS. 1, 4A-C, 5, and 6, which schematically show selected steps of the method 300.

Referring to FIG. 3, at step 302, a wafer heater is provided. Herein, the word 'provide' is used in a broad sense to encompass all modes of procurement, including, but not limited to, 'purchasing', 'preparing', 'manufacturing', 'arranging', 'setting in order', or 'bringing in for use' the object of provision, which is, in the instant case, the wafer processing platform. Referring also to FIG. 1, a first wafer heater 120 is disposed, in an embodiment of the present disclosure, upon a wafer processing platform 130 in a process chamber. For some embodiments, a second heater 122 is disposed above the platform 130, and above where the wafer 110 will be positioned in the process chamber. In some embodiment, the platform 130 may be equipped with a suitable means for make an ultra-fine alignment of the wafer 110 to a predetermined orientation and position for a highly precise processing. Also, in one embodiment, the platform 130 may further equipped with a suitable means for rotating the wafer 110 during a chemical layer formation, heating the wafer, or other wafer processing steps. Such means for securing, aligning, or rotating the wafer 110 is well known in the art and not described herein further in detail.

Like the platform 130, the first wafer heater 120 is accordingly sized and configured to cover an entire surface of a wafer, and heat it substantially uniformly and simultaneously. The wafer 110 to be heated in the method 300 of the present disclosure may be any typical a thin sliced wafer used in the art, which is made of a suitable semiconductor material, such as a silicon crystal, and serves as a substrate for various microelectronic devices to be built in and over the wafer through many, in some cases more than 400, micro-fabrication process steps, such as doping or ion implantation, etching, deposition of various materials, and photolithographic patterning. The wafer 110 may be of any standard size, including the commonly used 400 mm and 450 mm wafers with respective thicknesses. As the size of the wafer 110 changes, the size of the first wafer heater 120 changes accordingly. Further, since the typical configuration of a standard wafer is a thin disc, the first wafer heater 120 may have a circular configuration as well in an embodiment.

In one embodiment, the first wafer heater 120 may be rigidly attached to the upper surface of the platform 130 and configured to rotate together with the wafer 110 placed upon the upper surface of the wafer heater 120 if the particular embodiment demands rotating the wafer 110 during the chemical material application and/or heating and/or other wafer processing. In this case, the upper surface of the first wafer heater 120 should be flat and suitably configured to securely hold the wafer 110 thereon. In another embodiment, the first wafer heater 120 may be slightly separated from the platform 130 while still being disposed above it. Further, in still another embodiment, the wafer 110 may not be placed directly upon the physical surface of the first wafer heater 120, but slightly separated therefrom while the lower surface of the wafer 110 is facing parallelly the surface of the first wafer heater 120 as shown in FIG. 1. In this particular embodiment, the separation between the wafer 110 and the heater 120 is suitably determined such that still an effective heating may be performed despite the separation. In this case, there may be a separate means for securing, aligning, or rotating the wafer 110 during the heating, chemical layer forming, or other processing in one embodiment, or in another, they may be the same ones that are equipped to the platform 130 mentioned above.

In an embodiment of the present disclosure, the first wafer heater 120 is adapted to heat up the wafer 110 to produce any differential temperature profile as desired or targeted. Depending on a particular type of a wafer processing step, the wafer 110 may sometimes need to be heated up uniformly so that it may have the same temperature across its entire area. At other times, the wafer 110 may need to be heated up differentially such that different areas on it may have different temperatures according to some predetermined temperature profile. Accordingly, in the referred particular embodiment, the first wafer heater 120 is configured to be capable of heating any particular portion of a wafer 110 that is facing the heater 120, either in contact therewith or slightly separated therefrom, up to any particular preset temperature. For that, the first wafer heater 120 may have a variety of different structures and modes that serve the purpose.

Figure 4A:
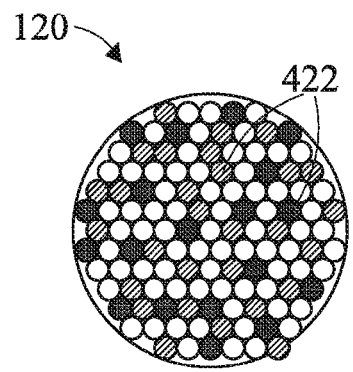
FIGS. 4A-4C schematically show examples of a wafer heater used in the system and method performed to process wafers in fabricating a semiconductor device according to aspects of the present disclosure.

In one embodiment, schematically illustrated in FIG. 4A, the first wafer heater 120 may have a plurality of radiation sources or lamps 422 as heat sources, which are attached to one face of a base, made of a ceramic or other suitable material. Each radiation source 422 is electrically coupled to a temperature control unit (not shown) such that the power supplied thereto or the heat energy radiated therefrom may be individually controlled. By controlling the power or heat energy of individual radiation sources 422, the first wafer heater 120 can generate any differential temperature profile as desired and heat up the wafer 110 accordingly.

Figure 4B:
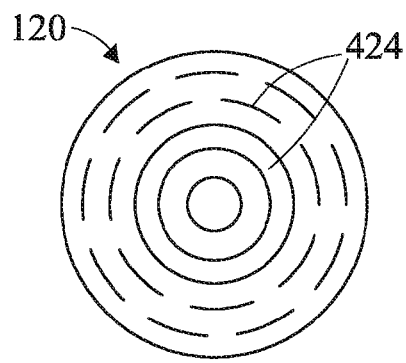

In another embodiment, now schematically illustrated in FIG. 4B, the first wafer heater 120 may have a plurality of heat coils 424 as heat sources that are concentrically arranged and attached to one face of a base, again made of a ceramic or other suitable material. Again, the coils 424 may be electrically coupled to a temperature control unit (not shown) such that the power supplied to, or the heat energy radiated from, coils of different diameters, or portions in a single coil of a same radius but different circumferential positions, may be individually controlled. Then, the wafer 110 can be heated up with different temperatures at different locales according to any predetermined differential temperature profile by controlling the power or heat energy of individual coils 424.

Figure 4C:
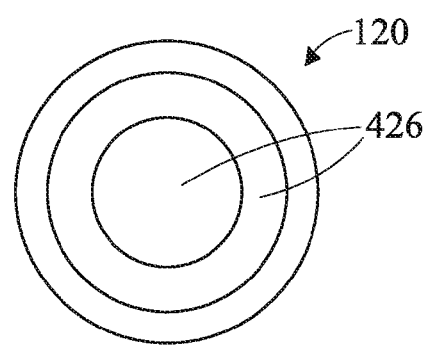

In still another embodiment, the first wafer heater 120 may have a plurality of heating plates or panels 426 formed on one face of a base made of a ceramic or other suitable material as schematically shown in FIG. 4C. The heating plates 426 may have an annular configuration and be circumferentially arranged as shown in FIG. 4C in an embodiment, but in other embodiments, they may have, and be arranged in, any other suitable geometrical configuration, for example, square or rectangular heating plates arranged in a meshed or laddered fashion. The number, the individual size or configuration of the heating plates 426 also may be suitably adjusted according to different design needs. Whatever the number, size, configuration, or arrangement of the individual heating plates 426 is, the heating plates 426 may be electrically coupled to a temperature control unit (not shown) such that the hear energy produced from a particular heating plate 426 at a particular position may be individually controlled, just as in other embodiments described above. Then, the wafer 110 can be heated up, again, to any temperature profile desired by controlling the power supplied to each individual heating plate 424 of the first wafer heater 120.

Figure 5:
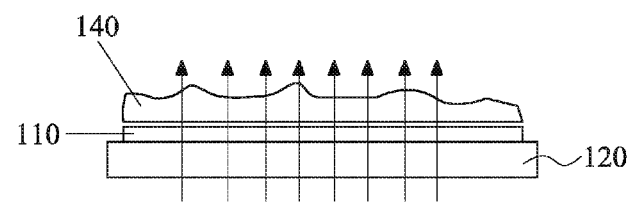
FIG. 5 is a schematic view of part of the system and method performed to process wafers in fabricating a semiconductor device, particularly for heating a wafer, in an aspect of the present disclosure.

Referring back to FIG. 3, at step 304, a wafer is placed over the wafer heater. FIG. 1 schematically shows how the wafer 110 is disposed with respect to the first wafer heater 120 in an embodiment of the present disclosure. The wafer 110 used herein is any typical thin sliced wafer used in the current art, made of a suitable semiconductor material, such as a silicon crystal, and serving as a substrate for various microelectronic devices that are to be built in and over the wafer through hundreds of micro-fabrication process steps. The wafer 110 has two opposing surfaces, a first wafer surface 102 and a second wafer surface 104, and placed over the first wafer heater 120 such that the second wafer surface 104 faces the first heater 120 in a parallel manner as shown in FIG. 1. The first wafer heater 120 is appropriately sized and configured such that it is capable of applying heat to the entire second wafer surface 104 uniformly and simultaneously if a uniform temperature profile is desired. In one embodiment, the wafer 110 may be placed upon the first wafer heater 120, directly in contact therewith as shown in FIG. 5. If it is needed to rotate the wafer 110 during the heating process for more uniform and evener heat distribution (as shown by the arrow in FIG. 1), the wafer 110 may be configured to rotate, together with the first wafer heater 120 in an embodiment, or alone upon the fixed heater 120 by a separate suitable rotation mechanism (not shown).

In still another embodiment, the wafer 110 may be placed over the wafer heater 120, slightly separated therefrom as shown in FIG. 1. This embodiment may work well in a situation where the wafer 110 needs to be rotated independently from the first wafer heater 120 via a separate rotation means during the process of heating or the chemical material application that is to be described in the subsequent step. In this case, the separation between the first wafer heater 120 and the wafer 110 needs to be sufficiently close so as not to impair the efficiency of the heating. Also, in this particular embodiment, the wafer 110 may be held above the first wafer heater 120 by a separate securement means (not shown). Further, there may be a separate alignment means as well for fine alignment of the wafer 110.

Referring back to FIG. 3, now at step 306, a chemical material is disposed over the first wafer surface 102 to form a chemical layer 140. The chemical material(s) could be any chemical(s) applied to a wafer during a wafer processing in which a chemical reaction between the chemical(s) and the wafer is desired and the wafer is heated to boost up the chemical reaction. In one embodiment, such a wafer processing may be a pre-cleaning, a post-cleaning, or an etching process, in which case, the chemical materials may be appropriate cleaning agents or etchants. The chemical material(s) may comprise a single or multiple chemicals mixed depending on the type of the chemical reaction needed. In one embodiment, the chemical material(s) is in a liquid form and is sprayed upon the wafer 110 by an overhead sprayer 145 to form a thin chemical layer 140. The wafer 110 may be rotated during the chemical layer formation for even, uniform thickness. While spraying the chemical material(s) 140, if a further uniformity is desired, the overhead sprayer 145 may move around over the wafer 110 at a regular speed to cover the entire first wafer surface 102. Some wafer processing, however, may require a formation of the chemical layer 140 of locally variant thicknesses. For that, the sprayer 145 may be configured to spray different amount of chemical material(s) at different locations above the wafer 110 via a connection to a computer control unit. FIG. 5 schematically illustrates the chemical layer 140 formed upon the first wafer surface 102 of the wafer 110. In the particular embodiment illustrated, the wafer 110 is placed such that the second wafer surface 104 is directly in contact with the upper surface of the first wafer heater 120. But as described hereinbefore, the wafer 110 may be placed at a small distance above the first wafer heater 120 in another embodiment.

Lastly, at step 308, the wafer 110 is heated by the first wafer heater 120 to produce a target temperature profile on the wafer 110. As can be seen from FIGS. 1 and 5, in the present disclosure, the wafer 110 is directly heated by the heater 120 from the second wafer surface 104. The heat flux flows from a wafer surface opposite to the surface where the chemical layer is formed to the very surface where it is formed. In that arrangement, the chemical material(s) is only indirectly heated up through the heating of the wafer 110. The benefits of such a direct heating of the wafer are obvious as compared to the conventional manner in the current art of heating the wafer through a direct heating of the chemical material(s). The method in the present disclosure makes it much easier to fine-control the temperature of the wafer due to the direct heating of the wafer. As will be described below, the capability of fine-controlling the heating of the wafer further enables heating up the wafer according to any differential temperature profile on the wafer by closely monitoring the temperature profile on the wafer during the heating process and readily adjusting the local power of the wafer heater by an instant feedback system. Further, the problem of abrupt and radical expansion of the chemical gas as it goes through the liquid-gas phase change, which is caused by direct heating of the chemicals and damages the patterns formed on the wafer, can be avoided. Still further, the chemical reaction rates can be boosted in the present method by heating up the wafer to a temperature even higher than the boiling temperature of the chemical material(s) while still restraining the chemical(s) from undergoing a rapid phase change.

The target temperature profile to be achieved on the wafer 110 is determined, based on various process needs of a particular type of the wafer processing to be performed. In one process, a uniform temperature profile may be preferred. In another, a locally differential temperature profile may be desired. In one embodiment, the target temperature profile may be predetermined before the heating of the wafer 110 is started. In another embodiment, the target temperature profile may be obtained while being constantly adjusted during the heating process so that the wafer 110 may have an optimum temperature profile that that would produce the highest chemical reaction rates or best performance in other types of wafer processing.

Figure 6:
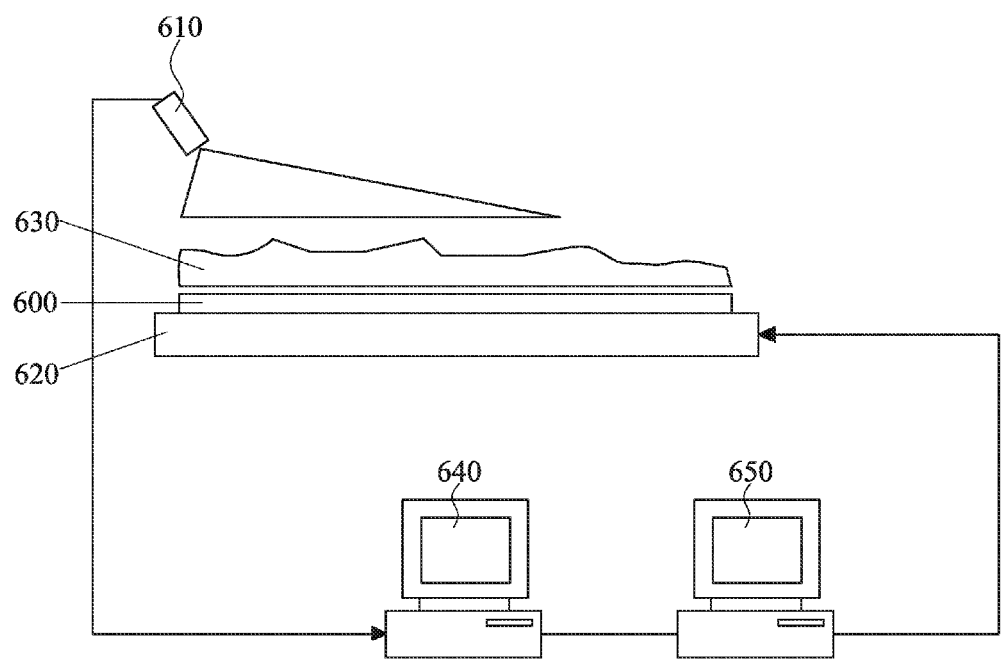
FIG. 6 a schematic diagram of a step in the method performed to process wafers, particularly for heating a wafer, in fabricating a semiconductor device in an aspect of the present disclosure.

FIG. 6 schematically illustrates how an optimum temperature profile can be determined in an embodiment. In the particular embodiment illustrated, a temperature sensor 610 is disposed above or adjacent the chemical layer 630 or the wafer 600 heated by the first wafer heater 620. The temperature sensor 610 may constantly monitor the actual local temperature profile on the surface of the wafer 600 and transmit the profile to a computing system 640. On the other hand, another computing system 650, electrically coupled with the computing system 640, may independently receive real time in-line data on the various states of the wafer 600 and the wafer processing being performed, such as the local thicknesses of the chemical layer 630 being formed, the current rate of chemical reaction occurring on the wafer 600, the progress level of a particular wafer processing being performed, . . . etc. Based on the actual local temperature profile and the real time in-line data, the computing system 650 may determine the instantaneous target temperature profile to be achieved and relays it to a temperature control unit, which may be present as a separate computer or a part of the computing system 650. According to the instantaneous target temperature profile received, the temperature control unit can adjust the power outputs for the various types of individual heating elements in the first wafer heater 620, illustrated in FIGS. 4A, 4B, and 4C, to control the local temperatures on the wafer 600. Accordingly, the method 300 in the present disclosure may further comprise the steps of monitoring actual temperature profile on the wafer by a temperature sensor and controlling the target temperature profile depending on the actual temperature profile.

In one embodiment of the present disclosure, the method 300 may further comprise heating the chemical layer 140 formed on the wafer 110 by a second heater 122 disposed above the chemical layer 140, as shown in FIG. 1, for supplemental control of the wafer temperature. The supplementary heater 122 may take various forms used in the current art, illustrated in FIGS. 4A, 4B, and 4C. For instance, the supplementary heater may be a fixed one covering the entire chemical layer in an embodiment. In another embodiment, it may be positioned at a side of the chemical layer formed on a rotating wafer. In another embodiment, a steamed heating system may be employed as the supplemental heater. The supplementary heater used in the present disclosure is different from those used in the conventional heating system in the usage and function. In the conventional methods, the heater disposed over the chemical layer are the primary, in fact the only, heater used for heating up the wafer. Therefore, frequently it is needed to heat up the chemical materials even past the boiling temperature of the chemical(s) to raise the wafer temperature to a degree sufficient for a desired chemical reaction rate, which involves many problems noted above, arising from the phase change of the chemical(s). By contrast, the heater of the various types used in the method of the present disclosure heats up the chemical material(s) only for a supplemental purpose, i.e., for ultra-finer control of the wafer temperature in combination with the wafer heater located under the wafer, which performs the primary heating. As such, the supplementary heater in the present disclosure never needs to heat up the chemical(s) above the boiling temperature to cause pattern collapse problem described above.

The novel method in the present disclosure of directly heating the wafer during the various wafer processing steps in fabricating a semiconductor device provides many benefits over the conventional methods used in the current art of directly heating the chemical material(s), and thereby, heating the wafer indirectly. The method in the present disclosure makes it much easier to fine-control the temperature of the wafer since the wafer is directly heated. If desired, heating up the wafer in a more uniform temperature distribution is enabled. Further, the capability of fine-controlling the heating of the wafer further enables heating up the wafer according to any differential temperature profile on the wafer as desired. The actual temperature profile on the wafer during the heating process can be monitored, and using a computing system, current temperature profile can be readily adjusted to a new target temperature profile, which can be immediately implemented on the wafer by a wafer heater that is capable of heating up the wafer locally differentially as desired. Further, the problem, commonly present in the conventional method of directly heating the chemicals, of abrupt and radical expansion of the chemical gas in short time as it goes through the liquid-gas phase change, which seriously damages the patterns formed on the wafer, can be avoided in the present method. Still further, since the temperature restraint from chemical property is removed, a higher chemical reaction rate can be obtained in the present method by heating up the wafer even to a temperature higher than the boiling temperature of the chemical material(s) while still restraining the chemical(s) from undergoing a rapid phase change.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for processing a wafer having opposing first and second wafer surfaces, comprising:
a chemical disposer configured to dispose a chemical material over the first wafer surface to form a chemical layer;
a first heater configured to heat the wafer from the second wafer surface when the wafer is placed over the first heater such that the second wafer surface faces the first heater, wherein the first heater is further configured to produce a locally differential target temperature profile on the wafer; and
a controller configured to control the first heater to heat the wafer up to a temperature above the boiling temperature of the chemical layer by applying heat from the first heater to the second wafer surface and heating the chemical layer up to a temperature below the boiling temperature of the chemical layer by applying heat from the first heater to the second wafer surface.

2. The system of claim 1, further comprising a temperature sensor for monitoring an actual temperature profile on the wafer.

3. The system of claim 2, further comprising a computing system electrically coupled to the temperature sensor and the first heater for controlling the target temperature profile depending on the actual temperature profile.

4. The system of claim 1, wherein the first heater is sized and configured to be capable of heating the entire second wafer surface substantially uniformly and simultaneously.

5. The system of claim 4, further comprising a second heater configured for heating the chemical layer after formation thereof.

6. The system of claim 1, further comprising a rotation mechanism for rotating the wafer while being heated.

7. The system of claim 1, wherein the first heater comprises radiation sources for producing heat.

8. The system of claim 1, wherein the first heater comprises electric coils for producing heat.

9. The system of claim 1, wherein the first heater comprises a plurality of heating plates that are capable of locally differential heating.

10. A system comprising:
a first heater disposed under a first side of a substrate, the substrate having a material layer disposed over a second side of the substrate that is opposite the first side of the substrate;
a second heater disposed over the second side of a substrate; and
a controller configured to control the first and second heaters to heat the substrate up to a temperature above the boiling temperature of the material layer by applying heat from the first heater to the first side of the substrate and heating the material layer up to a temperature below the boiling temperature of the material layer by applying heat from the first heater to the first side of the substrate.

11. The system of claim 10, further comprising a temperature sensor in communication with the controller and configured to measure an actual temperature of the first side of the substrate during the heating of the substrate up to the temperature above the boiling temperature of the material layer and during heating of the material layer up to the temperature below the boiling temperature of the material layer.

12. The system of claim 10, wherein the first heater covers the entire first side of the substrate, and
wherein a portion of the second side of the substrate is uncovered by the second heater.

13. The system of claim 10, further comprising a dispenser configured to dispense the material layer onto the substrate.

14. The system of claim 10, wherein first heater physically contacts the first side of the substrate.

15. The system of claim 10, wherein the first heater and the substrate are spaced apart.

16. The system of claim 10, wherein the first heater and the substrate are configured to rotate independently of each other while the first heater is applying heat to the second side of the substrate.

17. A system comprising:
a first heater disposed under a first side of a substrate, the substrate having a material layer disposed over a second side of the substrate that is opposite the first side of the substrate; and
a controller configured to control the first heater to heat the substrate up to a temperature above the boiling temperature of the material layer by applying heat from the first heater to the first side of the substrate and heating the material layer up to a temperature below the boiling temperature of the material layer by applying heat from the first heater to the first side of the substrate.

18. The system of claim 17, further comprising a temperature sensor in communication with the controller and configured to measure an actual temperature of the first side of the substrate during the heating of the substrate up to the temperature above the boiling temperature of the material layer and during heating of the material layer up to the temperature below the boiling temperature of the material layer, and
wherein the controller is further configured to control the heating of the substrate by the first heater based on the actual temperature.

19. The system of claim 17, further comprising a second heater disposed over the second side of the substrate and configured to heat the material layer.

20. The system of claim 17, wherein the first heater is sized and configured to uniformly heat the entire first side of the substrate.

* * * * *